(12) United States Patent
Murazaki et al.

(10) Patent No.: US 8,384,092 B2
(45) Date of Patent: Feb. 26, 2013

(54) LIGHT EMITTING DEVICE

(75) Inventors: Yoshinori Murazaki, Anan (JP);
Masafumi Harada, Anan (JP); Suguru Takashima, Anan (JP)

(73) Assignee: Nichia Corporation, Anan-Shi (JP)

( * ) Notice: Subject to any disclaimer, the term of this patent is extended or adjusted under 35 U.S.C. 154(b) by 42 days.

(21) Appl. No.: 12/675,713

(22) PCT Filed: Aug. 29, 2008

(86) PCT No.: PCT/JP2008/065521
§ 371 (c)(1),
(2), (4) Date: May 26, 2010

(87) PCT Pub. No.: WO2009/028657
PCT Pub. Date: Mar. 5, 2009

(65) Prior Publication Data
US 2010/0224895 A1    Sep. 9, 2010

(30) Foreign Application Priority Data

Aug. 30, 2007   (JP) .............................. P 2007-224034

(51) Int. Cl.
*H01L 27/108*    (2006.01)
*H01L 29/94*    (2006.01)

(52) U.S. Cl. .............. 257/79; 257/88; 257/E33.001; 362/293; 362/297; 362/304; 362/231; 362/278; 313/113; 313/467

(58) Field of Classification Search .......... 257/79, 257/88, E33.001; 362/293, 297, 304, 231, 362/278, 561, 610, 612, 615, 617; 313/113, 313/467

See application file for complete search history.

(56) References Cited

U.S. PATENT DOCUMENTS

| 7,582,906 B2 * | 9/2009 | Kurihara .................. 257/79 |
| 7,661,841 B2 * | 2/2010 | Kurihara et al. .......... 362/231 |
| 2003/0008468 A1 | 1/2003 | Ellen et al. |
| 2003/0038295 A1 | 2/2003 | Koda |
| 2004/0135504 A1 | 7/2004 | Tamaki et al. |
| 2004/0207313 A1 | 10/2004 | Omoto et al. |
| 2005/0057145 A1 | 3/2005 | Shieh et al. |
| 2005/0156496 A1 | 7/2005 | Takashima et al. |
| 2006/0263627 A1 | 11/2006 | Grampeix et al. |

(Continued)

FOREIGN PATENT DOCUMENTS

| CN | 1677695 A | 10/2005 |
| JP | 2004-327492 A | 11/2004 |

(Continued)

OTHER PUBLICATIONS

U.S. Office Action issued in co-pending U.S. Appl. No. 12/675,722 dated Aug. 16, 2012.

(Continued)

*Primary Examiner* — Telly Green
(74) *Attorney, Agent, or Firm* — Birch, Stewart, Kolasch & Birch, LLP

(57) ABSTRACT

A light emitting device that has excellent color rendering performance is provided.
The light emitting device comprises, a light emitting element, a red phosphor formed from a nitride phosphor that emits light when excited by the light from the light emitting element, a green phosphor formed from a halosilicate that emits light when excited by the light from the light emitting element and a YAG phosphor emitting light when excited by the light from the light emitting element.

3 Claims, 5 Drawing Sheets

U.S. PATENT DOCUMENTS

| | | |
|---|---|---|
| 2006/0279196 A1 | 12/2006 | Hsu |
| 2007/0057626 A1 * | 3/2007 | Kurihara et al. ............... 313/503 |
| 2007/0147032 A1 | 6/2007 | Furukawa et al. |
| 2007/0200095 A1 * | 8/2007 | Murazaki ................ 252/301.4 H |
| 2007/0210326 A1 * | 9/2007 | Kurihara ........................ 257/98 |
| 2007/0259206 A1 | 11/2007 | Oshio |
| 2008/0035887 A1 * | 2/2008 | Iwao et al. ............... 252/301.4 F |
| 2008/0128654 A1 | 6/2008 | Oshio |
| 2008/0149893 A1 | 6/2008 | Chen et al. |
| 2008/0149957 A1 | 6/2008 | Kameshima et al. |
| 2008/0182127 A1 | 7/2008 | Oshio |
| 2008/0191610 A1 | 8/2008 | Oshio |
| 2008/0211389 A1 | 9/2008 | Oshio |
| 2008/0258110 A1 | 10/2008 | Oshio |
| 2009/0250663 A1 | 10/2009 | Oshio |
| 2009/0295272 A1 | 12/2009 | Oshio |
| 2010/0171440 A1 * | 7/2010 | Satou et al. .................... 315/294 |
| 2010/0225226 A1 * | 9/2010 | Murazaki et al. ............. 313/503 |

FOREIGN PATENT DOCUMENTS

| | | |
|---|---|---|
| JP | 2006-219636 A | 8/2006 |
| JP | 2006-523245 A | 10/2006 |
| JP | 2006-306981 A | 11/2006 |
| JP | 2006-332134 A | 12/2006 |
| JP | 2007-27796 A | 2/2007 |
| JP | 2007-88248 A | 4/2007 |
| JP | 2007-145958 A | 6/2007 |
| WO | WO 2006/077740 A1 | 7/2006 |

OTHER PUBLICATIONS

Machine translation of Hosokawa et al. JP 2006-306981 A, Sep. 11, 2006.

U.S. Office Action issued in co-pending U.S. Appl. No. 12/675,722 dated Mar. 9, 2012.

* cited by examiner

LIGHT EMITTING DEVICE

TECHNICAL FIELD

The present invention relates to a light emitting device, and particularly to a light emitting device that contains a light emitting element, a red phosphor, a green phosphor and a YAG phosphor, and emits white light.

BACKGROUND ART

To provide a light emitting device that emits white light of warm color tone having high flux and high color rendering performance, it has been proposed to constitute the light emitting device from a blue semiconductor light emitting element, a red phosphor and a green phosphor that emit light when excited by the light from the light emitting element (refer to, for example, Patent Document 1).

Such light emitting devices show high intensity of emission in a region of reddish colors, and are used for various applications.

Patent Document 1: JP2007-27796A

DISCLOSURE OF THE INVENTION

Problems the be Solved by the Invention

However, the white light emitting device has diversified applications, and the conventional light emitting device comprising the blue semiconductor light emitting element (blue LED), the red phosphor and the green phosphor as described above may not be able to obtain sufficient color rendering performance.

Applications of the white light emitting device include, for example, general lighting. The white light emitting device of the conventional art described above may not be able to ensure sufficient color rendering performance due to mean color rendering index Ra of 70 or less. Use of such a lighting device that has insufficient color rendering performance results in a problem that objects look in different colors compared to a case of using a fluorescent lamp made for the general lighting application.

An object of the present invention is to provide a light emitting device that can be used in applications that require color rendering performance.

Means for Solving the Problems

A first aspect of the present invention is a light emitting device comprising, a light emitting element; a red phosphor formed from a nitride phosphor, that emits light when excited by the light from the light emitting element; a green phosphor formed from a halosilicate, that emits light when excited by the light from the light emitting element; and a YAG phosphor that emits light when excited by the light from the light emitting element.

A second aspect of the present invention is a light emitting device according to the first aspect, wherein the emission spectrum has a first peak at a wavelength between 440 nm and 470 nm, a second peak at a wavelength between 510 nm and 550 nm and a third peak at a wavelength between 630 nm and 670 nm, and the minimum relative light emission intensity between the second peak wavelength and the third peak wavelength of the emission spectrum is greater than 80% of whichever the lower of the relative light emission intensity of the second peak wavelength and the relative light emission intensity of the third peak wavelength.

A third aspect of the present invention is the light emitting device according to the first or second aspect, wherein the red phosphor is activated with Eu and is represented by the following general formula (I):

$$M^1{}_w Al_x Si_y B_z N_{((2/3)w+x+(4/3)y+z)}:Eu^{2+} \tag{I}$$

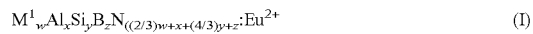

wherein $M^1$ is at least one kind of element selected from the group consisting of Mg, Ca, Sr and Ba, and relations: $0.056 \leq w \leq 9$, $x=1$, $0.056 \leq y \leq 18$ and $0 \leq z \leq 0.5$ are satisfied.

A fourth aspect of the present invention is the light emitting device according to any one of the first to third aspects, wherein the green phosphor is represented by the following general formula (II):

$$(M^2{}_{1-y}R_y)_a MgM^3{}_b M^4{}_c O_{(a+2b+(3/2)c)} X_2 \tag{II}$$

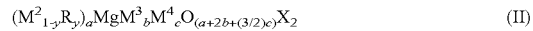

wherein $M^2$ is at least one kind of element selected from the group consisting of Ca, Sr, Ba, Zn and Mn, $M^3$ is at least one kind of element selected from the group consisting of Si, Ge and Sn, $M^4$ is at least one kind of element selected from the group consisting of B, Al, Ga and In, X is at least one kind of element selected from the group consisting of F, Cl, Br and I, R is at least one kind of element selected from among the rare earth elements so that Eu is contained as an essential element (or indispensable component), and relations: $0.0001 \leq y \leq 0.3$, $7.0 \leq a < 10.0$, $3.0 \leq b < 5.0$ and $0 \leq c < 1.0$ are satisfied.

A fifth aspect of the present invention is the light emitting device according to any one of the first to third aspects, wherein the green phosphor is represented by the following general formula (III):

$$M^5{}_x Eu_y MgSi_z Al_w O_a X_b N_c \tag{III}$$

wherein $M^5$ is at least one kind of element selected from the group consisting of Ca, Sr, Ba, Zn and Mn, X is at least one kind of element selected from the group consisting of F, Cl, Br and I, and relations: $6.5 \leq x < 8.0$, $0.01 \leq y \leq 2.0$, $3.7 \leq z \leq 4.3$, $0 < w \leq 0.5$, $a = x+y+1+2z+(3/2)w-b/2-(3/2)c$, $1.0 \leq b \leq 1.9$ and $0 \leq c \leq 3.0$ are satisfied.

A sixth aspect of the present invention is the light emitting device according to any one of the first to fifth aspects, wherein the difference between the peak wavelength of the light emitting element and the peak wavelength of the green phosphor is 80 nm or less.

A seventh aspect of the present invention is the light emitting device according to any one of the first to sixth aspects, wherein the YAG phosphor is represented by the following general formula (IV):

$$M^6{}_3 M^7{}_5 O_{12}:Ce \tag{IV}$$

wherein $M^6$ is at least one kind of element selected from the group consisting of the rare earth elements, and $M^7$ is at least one kind of element selected from the group consisting of B, Al, Ga and In.

Effects of the Invention

Combining a light emitting element, a red phosphor, a green phosphor and a YAG phosphor can provide a light emitting device having excellent color rendering performance.

Figure 1:
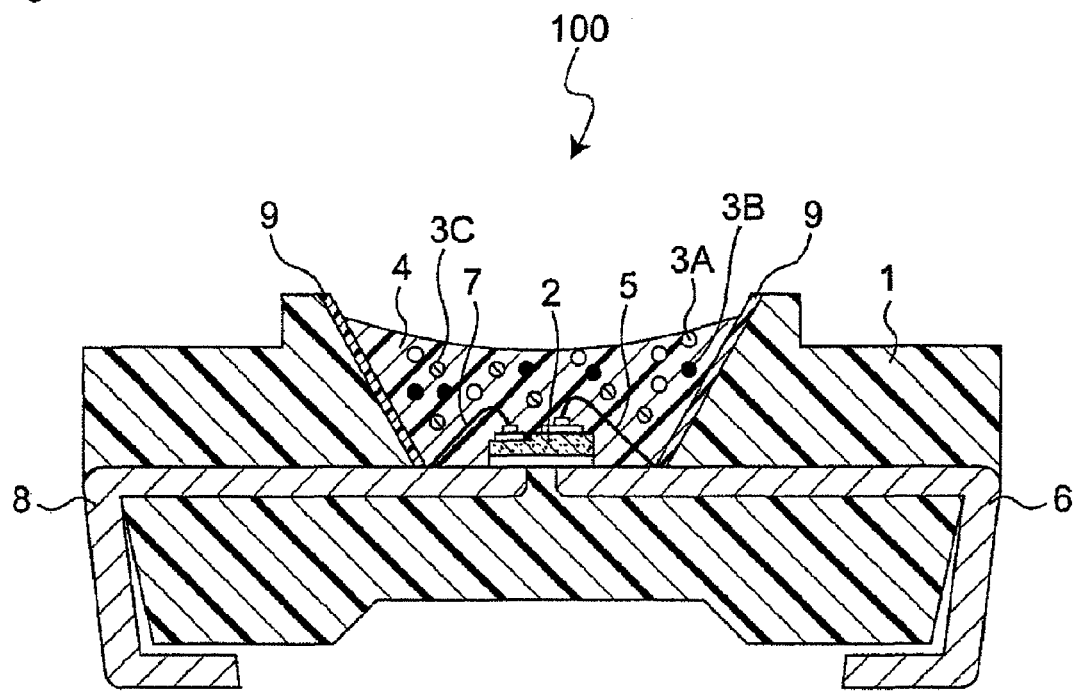
FIG. 1 is a sectional view showing the light emitting device 100 according to the present invention.

1 Body
2 Light emitting element
3A Red phosphor
3B Green phosphor
3C YAG phosphor
4 Translucent resin
5, 7 Electrically conductive wire
6, 8 External electrode
9 Light reflector
100 Light emitting device

BEST MODE FOR CARRYING OUT THE INVENTION

FIG. 1 is a sectional view of the light emitting device 100, showing an example of constitution of the light emitting device according to the present invention.

The light emitting device 100 according to the present invention comprises the light emitting element (for example blue LED) 2, the red phosphor (red light emitting phosphor) 3A that is excited by the light from the light emitting element 2 to emit red light, the green phosphor (green light emitting phosphor) 3B that is excited by the light from the light emitting element 2 to emit green light, and the YAG phosphor (YAG light emitting phosphor) 3C that is excited by the light from the light emitting element 2 to emit light in a region from yellowish green to yellow.

The red phosphor 3A is a nitride phosphor and the green phosphor 3B is a halosilicate. Thus the light emitting device 100 produces light by mixing the light emitted by the light emitting element (blue semiconductor light emitting element) 2, the light emitted by the nitride phosphor (red phosphor) 3A, the light emitted by the halosilicate (green phosphor) 3B and yellowish green or yellow light emitted by the YAG phosphor 3C, unlike the light emitting device of the conventional art that contains a blue semiconductor light emitting element (blue LED), red phosphor and green phosphor.

The light emitting device 100 having this constitution is capable of producing white light consisting of blue, green, yellow and red components each having high intensity. Use of the YAG phosphor 3C, in particular, enables it to supplement the emission of yellow and orange light so as to greatly improve the color rendering performance, thus resulting in a significant increase in the luminous flux. The light emitted by the light emitting device 100 shows excellent color rendering performance with mean color rendering index of 75 or higher.

The mean color rendering index Ra is an index of color rendering performance defined in the Japanese Industrial Standard JIS Z 8726. The index represents the fidelity of reproducing the colors in comparison to those of a reference light source. Ra value closer to 100 indicates better color rendering performance.

FIG. 1 shows an example of spectrum of light emitted by the light emitting device 100 according to the embodiment (Example 1). Emission spectrum of the light emitting device 100 has first to third peaks (peak wavelengths) from shorter to longer wavelength.

The first peak wavelength (the first emission peak wavelength) is attributed mainly to the light emitted by a light emitting element (blue LED) 2. The second peak wavelength (the second emission peak wavelength) is caused mainly by emission from a green phosphor 3B and a YAG phosphor 3C that are excited by the light emitted by the light emitting element 2. The third peak wavelength (the third emission peak wavelength) is caused mainly by emission form a red phosphor 3A that is excited by the light emitted by the light emitting element 2.

Figure 13:
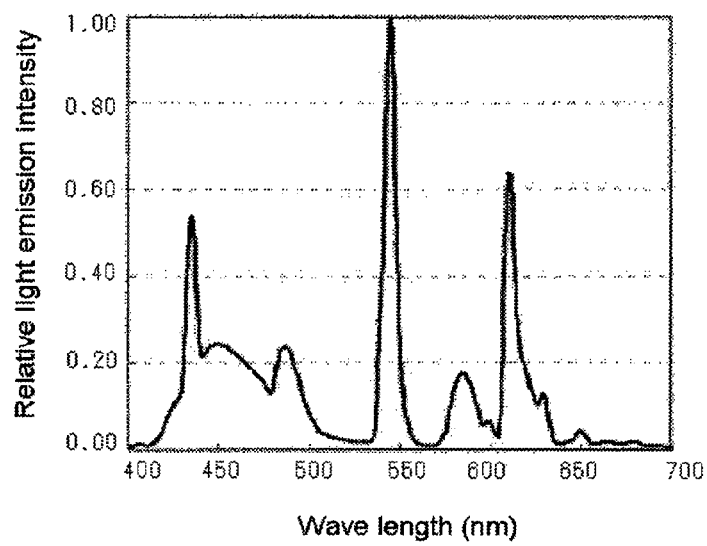
FIG. 13 is a graph showing an emission spectrum of a cold cathode fluorescent lamp (CCFL).
Figure 14:
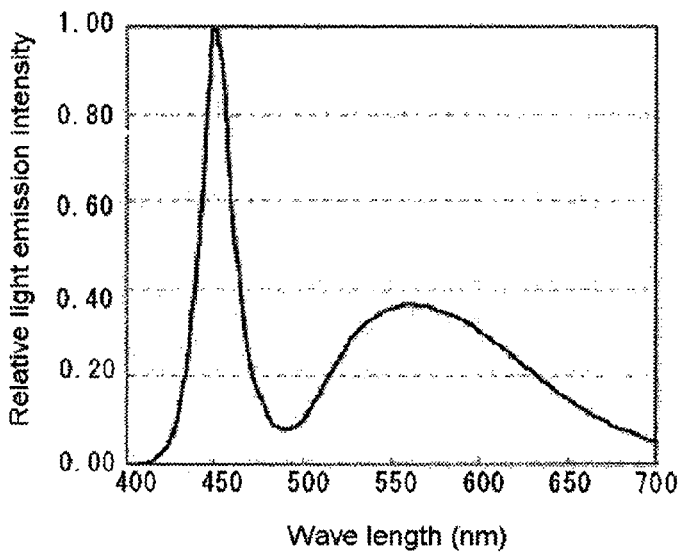
FIG. 14 is a graph showing an emission spectrum of a white LED of the conventional art.

For the purpose of comparison, FIG. 13 shows the emission spectrum of a cold cathode fluorescent lamp (CCFL) that has been used as the backlight of display apparatus, and FIG. 14 shows the emission spectrum of a light emitting device that blends light of two colors emitted by a blue LED and a YAG (yttrium-aluminum-garnet) phosphor that is excited by the light emitted by the blue LED.

The emission spectrum of a cold cathode fluorescent lamp (CCFL) has five sharp peaks including a peak around 435 nm due to mercury, a main peak around 545 nm due to a green phosphor and two sub-peaks around 490 nm and 585 nm. In contrast, the emission spectrum of the light emitting device that blends light of two colors shows only two peaks. Both the emission spectrum of the cold cathode fluorescent lamp (CCFL) and the emission spectrum of the light emitting device that blends light of two colors are different from the emission spectrum of the light emitting device 100 according to the present invention shown in FIG. 1.

The light emitting device 100 can further improve color rendering performance of light emission by satisfying four preferred conditions shown below.

Figure 6:
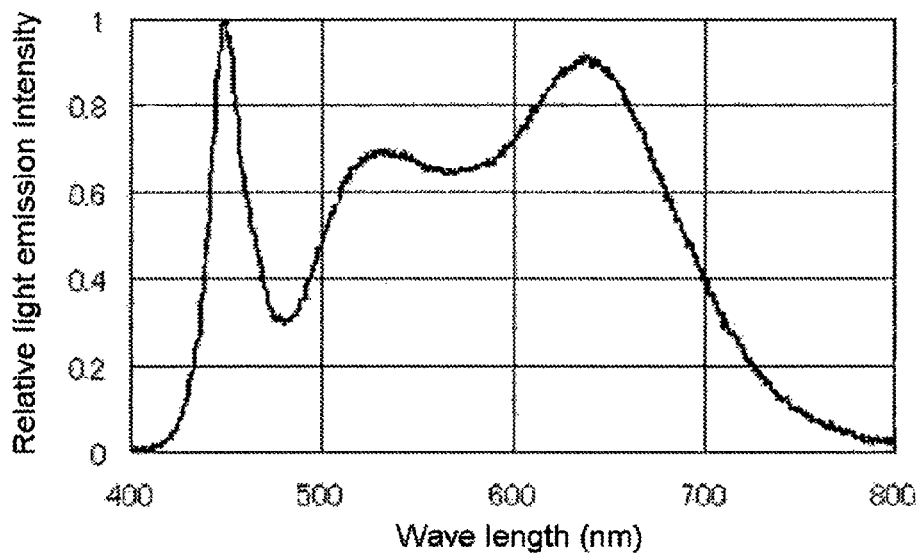
FIG. 6 is a graph showing an emission spectrum of the light emitting device 100 according to Example 5.

FIG. 6 shows an example of spectrum of light emitted by the light emitting device 100 according to an embodiment (Example 5) showing higher color rendering performance.

First, the light emitting element 2 is selected so that peak wavelength of the emission spectrum thereof is within an appropriate range (for example, between 440 nm and 470 nm) and that the first peak wavelength of the emission spectrum by the light emitting device 100 is between 440 nm and 470 nm.

Second, with the use of the green phosphor 3B and the YAG phosphor 3C which will be described in detail later, the second peak wavelength of the emission spectrum is between 510 nm and 550 nm.

Third, with the use of the red phosphor 3A which will be described in detail later, the third peak wavelength of the emission spectrum is between 630 nm and 670 nm.

Forth, the minimum relative light emission intensity between the second peak wavelength and the third peak wavelength (relative light emission intensity of the lowest value in a range between the second peak wavelength and the third peak wavelength of the emission spectrum) is greater than 80% of whichever the lower of the relative light emission intensity of the second peak wavelength and the relative light emission intensity of the third peak wavelength.

Very high color rendering performance with mean color rendering index Ra of, for example, 85 or higher can be obtained by satisfying the four conditions described above.

Such a high level of color rendering performance can be achieved because the white light that is produced has high intensity in any of the blue, green, yellow and red colors.

With regard to the fourth condition, it is possible to make the minimum relative light emission intensity between the second peak wavelength and the third peak wavelength of the emission spectrum greater than 80% of whichever the lower of the relative light emission intensity of the second peak wavelength and the relative light emission intensity of the third peak wavelength by, for example, setting the difference between the peak wavelength of the light emitting element 2 and the peak wavelength of the green phosphor 3B to 80 nm or greater.

It is also possible to make the minimum relative light emission intensity between the second peak wavelength and the third peak wavelength of the emission spectrum greater than 80% of whichever the lower of the relative light emission intensity of the second peak wavelength and the relative light emission intensity of the third peak wavelength, by increasing a amount of YAG phosphor 3C that emits light in the wavelength range between the second peak wavelength and the third peak wavelength.

In the meantime, the light emitting device 100 having excellent color reproducibility can be made by satisfying the first through third conditions, making the minimum relative light emission intensity between the second peak wavelength and the third peak wavelength 80% or less of whichever the lower of the relative light emission intensity of the second peak wavelength and the relative light emission intensity of the third peak wavelength, and setting the amount of YAG phosphor 3C to be added to 50% or less in weight percentage to the total phosphors added (sum of the amounts of the red phosphor 3A, the green phosphor 3B and the YAG phosphor 3C).

Accordingly, a lighting device that balances color rendering performance and color reproducibility at a high level can be made, that provides high color rendering performance with, for example, mean color rendering index Ra of 75 or higher and high color reproducibility with NTSC ratio of 72% or higher.

The NTSC ratio is the ratio of the area of a triangle defined by three chromaticity points (red, green, blue) of the display apparatus to be evaluated to the area of a triangle defined by the chromaticity points of three primary colors, red (0.670, 0.330), green (0.210, 0.710) and blue (0.140, 0.080), of the standard chromaticity (x, y) according to the CIE1931 XYZ display color system established by the National Television Standards Committee of the USA. The range of color reproducibility is defined by the area ratio, and a higher area ratio means higher color reproducibility. In broadcasting, standard NTSC ratio is usually set to 72%, and it is considered that NTSC ratio should be 72% or higher in order to provide satisfactory color reproducibility.

Thus the present invention provides the light emitting device of high color rendering performance that can be used in, for example, lighting device.

Also a lighting device that balances color rendering performance and color reproducibility at a high level can be made under the conditions described above. Such a lighting device that balances color rendering performance and color reproducibility at high level can be used as the backlight of liquid crystal display for monitor, digital camera, printer and the like.

While the first peak is formed mainly by the light emitted by the light emitting element 2, light emitted by the red phosphor 3A, light emitted by the green phosphor 3B and light emitted by the YAG phosphor 3C also contribute to the formation of the first peak. As a result, the first peak wavelength may be different from the peak wavelength of light emitted by the light emitting element 2.

Similarly, while the second peak is formed mainly by the light emitted by the green phosphor 3B and the light emitted by the YAG phosphor 3C which has a broader emission peak than the green phosphor 3B in most situations, light emitted by the light emitting element 2 and light emitted by the red phosphor 3A also contribute to the formation of the second peak. As a result, the second peak wavelength may be different from the peak wavelength of the green phosphor 3B.

Moreover, while the third peak is formed mainly by the light emitted by the red phosphor 3A, light emitted by the light emitting element 2, light emitted by the green phosphor 3B and light emitted by the YAG phosphor 3C also contribute to the formation of the third peak. As a result, the third peak wavelength may be different from the peak wavelength of the red phosphor 3A.

Components of the light emitting device 100 containing the red phosphor 3A, the green phosphor 3B, the YAG phosphor 3C and the blue LED 2 will be described in detail below.

1. Red phosphor

The red phosphor (red light emitting phosphor) 3A is formed from a nitride phosphor that absorbs ultraviolet ray or blue light emitted by the light emitting element 2 and emits red light.

A nitride phosphor activated with Eu and represented by the following general formula (I) containing group II element $M^1$, Si, Al, B and N may be preferably used as the red phosphor 3A.

$$M^1{}_w Al_x Si_y B_z N_{(2/3)w+x+(4/3)y+z}:Eu^{2+} \qquad (I)$$

In formula (I), $M^1$ is at least one kind of element selected from the group consisting of Mg, Ca, Sr and Ba, while w, x, y and z preferably satisfy relations: $0.056 \leq w \leq 9$, $x=1$, $0.056 \leq y \leq 18$ and $0.0005 \leq z \leq 0.5$.

More preferably w, x, y and z satisfy relations: $0.4 \leq w \leq 3$, $x=1$, $0.143 \leq y \leq 8.7$ and $0 \leq z \leq 0.5$, and most preferably satisfy $0.5 \leq w \leq 3$, $x=1$, $0.167 \leq y \leq 8.7$ and $0.0005 \leq z \leq 0.5$, which enable it to obtain a color tone, high brightness and half maximum full-width of light emission that are more desirable. The value of z is preferably 0.5 or less, more preferably 0.3 or less and not less than 0.0005. It is further preferable that molar concentration of boron is 0.001 or more and 0.2 or less. While the nitride phosphor is activated with Eu, a part of Eu may be substituted with at least one kind of rare earth element selected from the group consisting of Sc, Tm, Yb, Y La, Ce, Pr, Nd, Sm, Gd, Tb, Dy, Ho, Er and Lu.

In formula (I), $M^1$ is preferably at least one kind of Ca and Sr, while w, x, y and z preferably satisfy relations: $0.5 \leq w \leq 1.5$, $x=1$, $0.5 \leq y \leq 1.5$ and $0 \leq z \leq 0.3$, which enable it to obtain a color tone, high brightness and more desirable half maximum full-width of light emission and emission of light having richer red color tone with less orange color component.

Another preferable nitride phosphor is one represented by the following general formula (I'):

$$M^1{}_{1-z} AlSiB_z N_{(2/3)(1-z)+(7/3)+z}:Eu^{2+} \qquad (I')$$

wherein $M^1$ is at least one kind selected from the group consisting of Mg, Ca, Sr and Ba, while x is a range of $0.001 \leq x \leq 0.3$ and z is in a range of $0.0005 \leq z \leq 0.5$.

Further another preferable nitride phosphor is one represented by the following general formula (I"):

$$M^1{}_w AlSiB_z N_{(2/3)w+(7/3)+z}:Eu^{2+} \quad (I'')$$

wherein $M^1$ is at least one kind of element selected from the group consisting of Mg, Ca, Sr and Ba, while w is in a range of $0.04 \leq w \leq 3$ and z is in a range of $0.0005 \leq z \leq 0.5$.

In formulas (I), (I') and (I"), in case that Ca is used as $M^1$, it is preferable to use Ca individually. However, a part of Ca may be substituted with Sr, Mg or Ba, combination of Sr and Ba, or the like. Peak wavelength of the emission by the nitride phosphor can be controlled by substituting a part of Ca by Sr.

While Si is also preferably used individually, a part of Si may be substituted with group IV element C or Ge. A nitride phosphor that is low-cost and has good crystallinity can be obtained when only Si is used.

Light emitted by the red phosphor 3A has peak wavelength of preferably between 590 nm and 700 nm, more preferably between 630 nm and 670 nm, and further more preferably between 640 nm and 670 nm.

A composition of the red phosphor 3A may be adjusted in composition range described previously to set the peak wavelength of the red phosphor 3A within the desired range described above. The third peak wavelength of the light emitting device 100 can be shifted within a preferable range by shifting the peak wavelength of the red phosphor 3A.

In case that Ca is used as $M^1$, the peak wavelength of light emitted by the red phosphor 3A can be shifted to longer side by increasing Eu concentration and to shorter side by decreasing Eu concentration. Specifically, substituting 3 mol % of Ca with Eu sets the emission peak at 660 nm, and substituting 1 mol % of Ca by Eu sets the peak wavelength at 650 nm.

When Sr is used as part or entire $M^1$, the peak wavelength can be shifted to shorter side.

Shifting the peak wavelength of light emitted by the red phosphor 3A to shorter side usually causes the third peak wavelength of the light emitting device 100 to shift to shorter side, and shifting the peak wavelength of light emitted by the red phosphor 3A to longer side usually causes the third peak wavelength of the light emitting device 100 to shift to longer side.

As described previously, there can be a case where the peak wavelength of the red phosphor 3A does not agree with the third peak wavelength, and therefore the third peak wavelength may be set within a range from 630 nm to 670 nm even when the peak wavelength of the red phosphor 3A is not in the range from 630 nm to 670 nm.

The activator agent Eu is preferably used individually, although a part of Eu may be substituted with Sc, Tm, Yb, Y, La, Ce, Pr, Nd, Sm, Gd, Tb, Dy, Ho, Er or Lu. When a part of Eu is substituted with the other element, the other element functions as a co-activator. Use of the co-activator enables it to change the color tone and control the emission characteristic.

The red phosphor 3A that is a nitride phosphor may also contain at least one kind of element selected from the group consisting of group I elements of Cu, Ag and Au, group III elements of Ga and In, group IV elements of Ti, Zr, Hf, Sn and Pb, group V elements of P, Sb and Bi and group VI element of S, with total concentration from 1 to 500 ppm. Since these elements are scattered during a firing in the manufacturing process, concentration of these elements in the fired material is lower than the initial concentration when the material is prepared. Therefore, it is preferable to add these elements to the stock material with a concentration of 1,000 ppm or less. Efficiency of light emission can be controlled by adding these elements.

The ratio of the molar concentration of Fe, Ni, Cr, Ti, Nb, Sm and Yb to the molar concentration of $M^1$ is preferably 0.01 or lower. This is because an excessively high concentration of Fe, Ni, Cr, Ti, Nb, Sm and Yb may lower the brightness of emission.

2. Green Phosphor

The green phosphor (green light emitting phosphor) 3B will be described below. The green phosphor 3B is formed from a halosilicate. The green phosphor 3B absorbs ultraviolet ray or blue light emitted by the light emitting element 2 and emits green light.

A phosphor represented by the following general formula (II) may be used as the green phosphor 3B.

$$(M^2{}_{1-y}R_y)_a MgM^3{}_b M^4{}_c O_{(a+2b+(3/2)c)} X_2 \quad (II)$$

In formula (II), $M^2$ is at least one kind of element selected from the group consisting of Ca, Sr, Ba, Zn and Mn, $M^3$ is at least one kind of element selected from the group consisting of Si, Ge and Sn, $M^4$ is at least one kind of element selected from the group consisting of B, Al, Ga and In, X is at least one kind of element selected from the group consisting of F, Cl, Br and I, R is at least one kind of element selected from among the rare earth elements with Eu contained as an essential element (or indispensable component), while y, a, b and c satisfy relations: $0.0001 \leq y \leq 0.3$, $7.0 \leq a < 10.0$, $3.0 \leq b < 5.0$ and $0 \leq c < 1.0$.

The green phosphor represented by the general formula (II) contains at least one kind of element selected from the group consisting of Ca, Sr, Ba, Zn and Mn, preferably Ca. In case Ca is contained, a part of Ca may be substituted with Mn, Sr or Ba.

Of the phosphors represented by formula (II), more preferable green phosphor is represented by the following general formula (II'). The green phosphor 3B represented by the general formula (II') shows excellent color reproducibility, because of high brightness, narrow half maximum full-width of light emission and lower contents of blue-green and orange.

$$(M^2{}_{1-y} Eu_y)_a MgM^3{}_b O_{a+2b} X_2 \quad (II')$$

In formula (II'), $M^2$ is at least one kind of Ca and Mn, $M^3$ is at least one kind of Si and Ge, and X is at least one kind of element selected from the group consisting of F, Cl, Br and I.

Values of y, a and b satisfy the relations: $0.001 \leq y \leq 0.3$, $7.0 \leq a < 10.0$, and $3.0 \leq b < 5.0$.

The green phosphors represented by the general formulas (II) and (II') contain at least one kind of element selected from the group consisting of Ca, Sr, Ba, Zn and Mn, preferably Ca. In case Ca is contained, a part of Ca may be substituted with Mn, Sr or Ba.

The green phosphors represented by the general formulas (II) and (II') contain at least one kind of element selected from the group consisting of Si, Ge and Sn, preferably Si. In case Si is contained, a part of Si may be substituted with Ge or Sn.

The green phosphors represented by the general formulas (II) and (II') contain at least one kind of element selected from the group consisting of F, Cl, Br, and I, preferably Cl. In case Cl is contained, a part of Cl may be substituted with F, Br or I.

The green phosphor represented by the general formula (II) contains at least one kind of rare earth element with Eu contained as an essential element. The term rare earth collectively refers to 17 elements of scandium, yttrium and lanthanoid elements. Of these elements, Eu is most preferably used. A part of Eu may be substituted with Ce, Pr, Nd, Sm, Tb, Dy, Ho, Er, Tm or Yb. More preferably, a part of Eu may be substituted with Ce, Pr, Nd, Sm, Tb, Dy, Ho or Tm.

The green phosphors represented by the general formulas (II) and (II') have peak wavelength in a region ranging from green to yellow having wavelengths from 490 to 584 nm. The phosphors may have peak wavelength around a range from 500 nm to 520 nm when Ca, Eu, Mg, Si, O and Cl are contained, or around a range from 530 nm to 570 nm when Ca, Mn, Eu, Mg, Si, O and Cl are contained. Since the peak wavelength varies depending on the amounts of elements contained and the composition, the green phosphor 3B is adjusted as required so as to have the preferable peak wavelength.

The peak wavelength of the green phosphor 3B is preferably between 490 nm and 560 nm, more preferably between 500 nm and 550 nm, and further more preferably between 505 nm and 540 nm.

The second peak wavelength of the light emitting device 100 can be shifted within a desired range by shifting the peak wavelength of light emitted by the green phosphor 3B within the preferable range described above.

In a composition of $(Ca, Eu)_8MgSi_4O_{16}Cl_2$, for example, peak wavelength of the green phosphor 3B can be shifted to 525 nm on the longer side by increasing Eu concentration to 10 mol % of Ca. Peak wavelength can be shifted to the shorter side by decreasing the Eu concentration relative to Ca. For example, peak wavelength can be shifted to around 500 nm on the shorter side by decreasing Eu concentration to 1 mol % of Ca.

In a composition of $(Ca, Eu, Mn)_8MgSi_4O_{16}Cl_2$, the emission peak due to Eu only can be shifted to around 545 nm of Mn emission by increasing Mn concentration to 5 mol % of Ca.

As described previously, there can be a case where the peak wavelength of the green phosphor 3B does not agree with the second peak wavelength, and therefore the second peak wavelength may be set within a range from 510 nm to 550 nm even when the peak wavelength of the green phosphor 3B is not in the range from 510 nm to 550 nm.

As described previously, it is possible to make the minimum relative light emission intensity between the second peak wavelength and the third peak wavelength of the emission spectrum greater than 80% of whichever the lower of the relative light emission intensity of the second peak wavelength and the relative light emission intensity of the third peak wavelength by setting the difference between the peak wavelength of the light emitting element 2 and the peak wavelength of the green phosphor 3B to 80 nm or greater. The above-described methods for shifting the peak wavelength of the green phosphor 3B may be used to achieve the condition.

Another green phosphor represented by the following general formula (III) that can be used as the green phosphor 3B will be described below.

$$M^5{}_xEu_yMgSi_zAl_wO_aX_bN_c \quad (III)$$

In the general formula (III), $M^5$ is at least one kind of element selected from the group consisting of Ca, Sr, Ba, Zn and Mn, X is at least one kind of element selected from the group consisting of F, Cl, Br and I, while x, y, w, a, b and c satisfy the relations: $6.5 \leq x < 8.0$, $0.01 \leq y \leq 2.0$, $3.7 \leq z \leq 4.3$, $0 < w \leq 0.5$, $a = x+y+1+2z+(3/2)w-b/2-(3/2)c$, $1.0 \leq b \leq 1.9$ and $0 \leq c \leq 3.0$.

In the general formula (III), it is preferable that $w=0$ and $c=0$ which causes the green phosphor to emit light with higher brightness. In this case, the formula (III) can be written as $M^5{}_xEu_yMgSi_zO_aX_b$.

3. YAG Phosphor

The light emitting device 100 of the present invention has the YAG phosphor (YAG light emitting phosphor) 3C that emits light in a region from yellowish green to yellow, in addition to the red phosphor 3A and the green phosphor 3B.

Use of the YAG phosphor 3C enables it to supplement the emission of yellow and orange light so as to greatly improve the color rendering performance and increase in the luminous flux significantly.

Peak wavelength of the YAG phosphor 3C may be adjusted as required for the purpose of increasing the difference between the emission peak of the YAG phosphor 3C and the emission peak of the green phosphor 3B, in order to make it easier to make the minimum relative light emission intensity between the second peak wavelength and the third peak wavelength of the emission spectrum of the light emitting device 100 greater than 80% of whichever the lower of the relative light emission intensity of the second peak wavelength and the relative light emission intensity of the third peak wavelength.

Peak wavelength of the YAG phosphor 3C can be shifted to the longer side by substituting Y with Gd and to the shorter side by substituting Al with Ga. Also peak wavelength can be slightly shifted to the longer side by increasing the amount of Ce, or to the shorter side by decreasing the amount of Ce.

Since peak wavelength of the YAG phosphor is relatively close to peak wavelength of the green phosphor 3B, in many cases the emission peak corresponding to the emission peak of the YAG phosphor 3C is hid by the peak of the second peak wavelength attributed mainly to the peak wavelength of the green phosphor 3B and not shown in many cases.

There is no particular restriction on the YAG phosphor 3C that emits light in a range from yellowish green to yellow, and any known YAG phosphor (YAG light emitting phosphor) can be used. A phosphor is represented as an example by the following general formula (IV) that can be used as the preferable YAG phosphor 3C.

$$M^6{}_3M^7{}_5O_{12}:Ce \quad (IV)$$

In the formula (IV), $M^6$ is at least one kind of element selected from among rare earth elements, and $M^7$ is at least one kind of element selected from the group consisting of B, Al, Ga and In.

4. Constitution of Light Emitting Device

One embodiment of the light emitting device 100 will be described in detail with reference to FIG. 1. The light emitting device 100 shown in FIG. 1 is a surface-mounted light emitting device but is not limited to this, and the present invention can be applied to any forms of conventionally used light emitting device such as bullet-shaped light emitting diode.

The light emitting device 100 has light emitting element mounting body (body) 1 that has a recess opening upward. The light emitting element (blue LED) 2 is fastened with a die bonding material onto the bottom surface of the recess of the body 1, and a translucent resin 4 containing the phosphors 3A, 3B dispersed therein covers the light emitting element 2. The upper electrodes of the light emitting element 2 is connected by a first wire (electrically conductive wire) 5 to a first external electrode 6, and the lower electrode of the light emitting element 2 is connected by a second wire (electrically conductive wire) 7 to a second external electrode 8. Inner surface of the recess of the body 1 is covered by a light reflecting material 9.

Components of the light emitting device 100 will be described below.

Light Emitting Element

The light emitting element 2 has a light emitting layer formed from, for example, gallium nitride compound semiconductor, and emits light that forms the first peak in the emission spectrum of the white light emitting device 100 used in the present invention, while serving as the light source that excites the red phosphor 3A, the green phosphor 3B and the YAG phosphor 3C.

There are various nitride compound semiconductors (general formula: $In_iGa_jAl_kN$, however $0 \leq i$, $0 \leq j$, $0 \leq k$, $i+j+k=1$) such as containing InGaN and GaN that is doped with various impurities. The light emitting element 2 can be formed by growing semiconductor such as InGaN or GaN as a light emitting layer on a substrate by MOCVD process or the like. The semiconductor may have homo structure, heterostructure or double heterostructure such as MIS junction, PI junction and PN junction. Emission wavelength can be controlled by changing the kind of material and mix proportion of components of the nitride semiconductor layer, so that the light emitting element 2 has a peak wavelength in a range from 440 nm to 470 nm. The light emitting element 2 may also have a semiconductor active layer formed from a thin film where quantum effect appears in single quantum well structure or multiple quantum well structure.

Light Emitting Element Mounting Body

The light emitting element mounting body 1 is preferably formed from a material that has high light blocking property, so that light emitted by the light emitting element 2 would not leak to the outside. The body makes contact with the external electrodes 6, 8 and therefore must be formed from an insulating material.

Specifically, the body may be formed from, for example, laminated sheet of glass epoxy, laminated sheet of BT resin, ceramics, liquid crystal polymer or polyimide. The body 1 can be formed by, for example, placing metal pieces intended for the external electrodes 6 and 8 in a mold, pouring the material into the mold for insertion molding operation, then, after cooled, taking the molded body from the mold.

External Electrode

The external electrodes 6 and 8 are provided for electrically connecting the light emitting element 2 with the outside of the body 1 via the first wire 5 and the second wire 7, and are preferably formed from a material that has high electrical conductivity. For example, metallised material (e.g. nickel metallised material) or good electrical conductors such as phosphor bronze, iron or copper may be used for the external electrodes 6 and 8.

Light Reflecting Material

The light reflecting material 9 may be, for example, a film-like member formed from a polyethylene terephthalate resin, a polycarbonate resin, a polypropylene resin or the like, with barium titanate, aluminum oxide, titanium oxide, silicon oxide, calcium phosphate or the like mixed therein as a reflecting material. The light reflecting material 9 can be secured onto the side wall of the body 1 by means of silicone resin, epoxy resin or the like.

The light reflecting material 9 may also be a metal film such as Al, Ag, Cu or the like formed on the inside and/or the outside of the side wall of the body 1 by means of plating or sputtering process.

Die-Bonding Material

The die-bonding material is used to secure the light emitting element 2 in the recess of the body 1. The die-bonding material must be heat resistant so that the properties thereof would not be affected by the heat generated in the light emitting element 2. For example, epoxy resin, Ag paste or eutectic material may be used as the die-bonding material.

Electrically Conductive Wire

The first wire 5 and the second wire 7 are formed from electrically conductive wires. The first wire 5 and the second wire 7 are required to be good in ohmic contact with the electrodes of the light emitting element 2, in mechanical connectivity, electrical conductivity and heat conductivity. The electrically conductive wires used as the first wire 5 and the second wire 7 may be formed from a metal such as gold, copper, platinum, aluminum or an alloy thereof.

Translucent Resin

The translucent resin 4 that fills the recess of the body 1 contains the red phosphor 3A, the green phosphor 3B and the YAG phosphor 3C dispersed therein, and seals the light emitting element 2, the electrically conductive wires (the first wire and the second wire) 5 and 7 for the protection thereof from the external force. For the translucent resin (resin sealant) 4, various resins may be used and the translucent resin that has weatherability (or weather resistance) is preferably used such as an epoxy resin, a urea resin, or a silicone. Adding a dispersing agent to the translucent resin 4 decreases the directivity of emission from the light emitting element 2 and increases the view angle. For the dispersing agent, barium titanate, titanium oxide, aluminum oxide, silicon oxide or the like is preferably used. Various phosphors may be contained in the translucent resin in accordance to the color of light emitted by the light emitting element 2, so as to provide the light emitting device that emits light of desired color.

EXAMPLES

Examples of the present invention will be described below. These Examples are shown for the purpose of making the invention easier to understand, and are not intended to limit the scope of the present invention.

Example 1

A molten polyphthalamide resin is poured into a mold that has been closed after a pair of positive and negative external electrodes 6 and 8 has been placed therein, and is cured to form a body 1. The body 1 has an opening (recess) wherein the light emitting element 2 can be accommodated. The body 1 and the external electrodes 6 and 8 can be molded integrally, as the mold is cooled down.

The light emitting element (LED chip) 2 having a peak wavelength (dominant wavelength peak) of 455 nm is die-bonded onto the bottom surface of the recess of the body 1 that has been formed as described above. Then the external electrodes 6 and 8, and the light emitting element 2 are electrically connected by means of the electrically conductive wire 5 and 7.

Then 3 g of a silicone resin composition is mixed with about 0.3 g of a halosilicate $Ca_3MgSi_4O_{16}Cl_2$:Eu(($Ca_{7.6}$, $Eu_{0.4}$)$MgSi_4O_{16}Cl_2$) that has a peak at a wavelength around 520 nm, 0.1 g of a YAG phosphor ($Y_{2.95}(Al_{0.8},Ga_{0.2})_5O_{12}$:$Ce_{0.05}$) that has a broad emission spectrum with a peak at a wavelength around 540 nm and about 0.11 g of a nitride phosphor $CaAlSiBN_3$:Eu(($Ca_{0.97}$,$Eu_{0.03}$)$AlSiBN_3$) that has a peak at a wavelength around 660 nm. The translucent resin 4 that is obtained is put into the opening of the body 1 so as to form a surface flush with the top surface of the opening on both sides thereof. Last, the resin is subjected to heat treatment at 70° C. for three hours and 150° C. for one hour.

Figure 2:
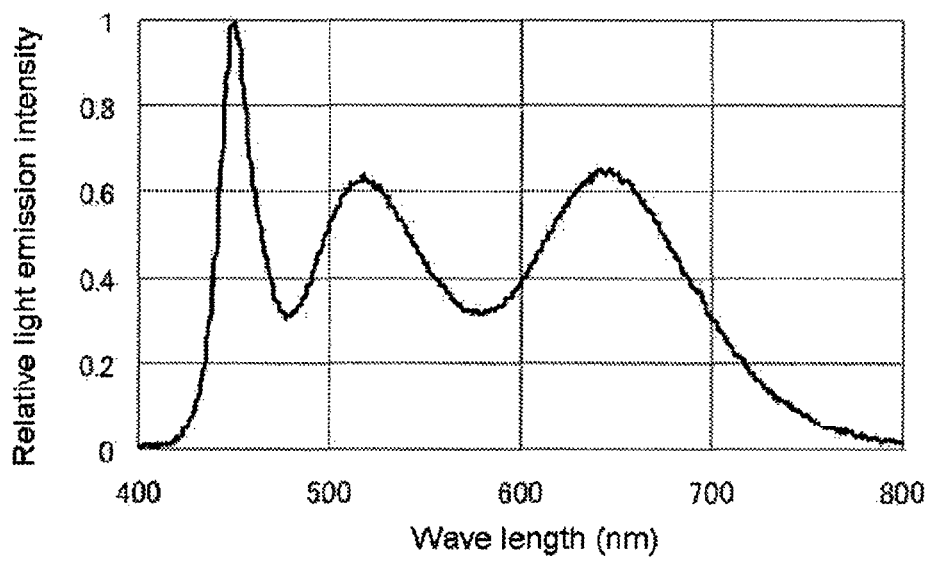
FIG. 2 is a graph showing an emission spectrum of the light emitting device 100 according to Example 1.

FIG. 2 shows the emission spectrum of the light emitting device 100 that is made as described above.

The spectrum has the first peak around 450 nm, the second peak around 520 nm and the third peak around 650 nm.

The minimum relative light emission intensity between the second peak wavelength and the third peak wavelength is 0.32, and is 52% of the relative light emission intensity of the second peak wavelength, 0.62, that is lower than the relative light emission intensity of the third peak wavelength that is 0.64. The mean color rendering index Ra which shows color rendering performance is 79, showing high color rendering performance.

A 14-inch liquid crystal backlight employing the light emitting device 100 as the light source has 72% or higher NTSC ratio, which shows color reproducibility, with higher brightness of white light.

The result shows the light emitting device 100 according to Example 1 has an excellent color rendering performance which is the purpose of the invention, and furthermore, has excellent color reproducibility.

Example 2

The light emitting device 100 is made by the same method as that of Example 1, except that about 0.3 g of a halosilicate $Ca_3MgSi_4O_{16}Cl_2:Eu((Ca_{7.6},Eu_{0.4})MgSi_4O_{16}Cl_2)$ that has a peak wavelength around 520 nm, 0.15 g of a YAG phosphor $(Y_{2.95}(Al_{0.8}, Ga_{0.2})_5O_{12}:Ce_{0.05})$ that has a peak wavelength around 540 nm and a broader emission spectrum than that of the green phosphor, and about 0.11 g of a nitride phosphor $CaAlSiBN_3:Eu((Ca_{0.97},Eu_{0.03})AlSiBN_3)$ that has a emission peak around 660 nm are mixed with 3 g of a silicone resin composition.

Figure 3:
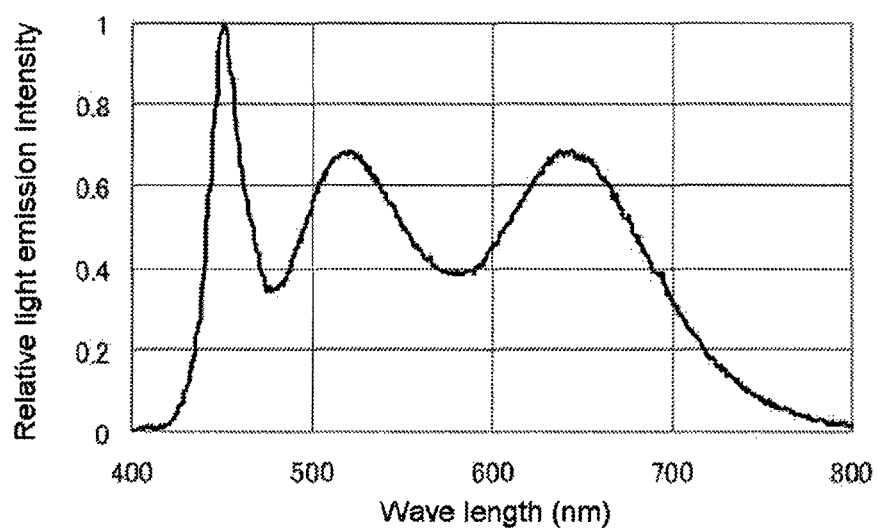
FIG. 3 is a graph showing an emission spectrum of the light emitting device 100 according to Example 2.

FIG. 3 shows the emission spectrum of the light emitting device 100 that is made as described above.

The spectrum has the first peak around 450 nm, the second peak around 520 nm and the third peak around 650 nm.

The minimum relative light emission intensity between the second peak wavelength and the third peak wavelength is 61% of the relative light emission intensity of the second peak wavelength that is lower than the relative light emission intensity of the third peak wavelength. Ra value is 84, showing high color rendering performance.

A light source for backlight made by using the light emitting device 100 similarly to Example 1 has NTSC ratio of 72% or higher, with further higher brightness of white light.

Example 3

The light emitting device 100 is made by the same method as that of Example 1, except that about 0.3 g of a halosilicate $Ca_3MgSi_4O_{16}Cl_2:Eu((Ca_{7.6},Eu_{0.4})MgSi_4O_{16}Cl_2)$ that has an emission peak around 520 nm, 0.25 g of a YAG phosphor $(Y_{2.95}(Al_{0.8}, Ga_{0.2})_5O_{12}:Ce_{0.05})$ that has an emission peak around 540 nm and a broad emission spectrum, and about 0.13 g of a nitride phosphor $CaAlSiBN_3:Eu((Ca_{0.97},Eu_{0.03})AlSiBN_3)$ that has an emission peak around 660 nm are mixed with 3 g of a silicone resin composition.

Figure 4:
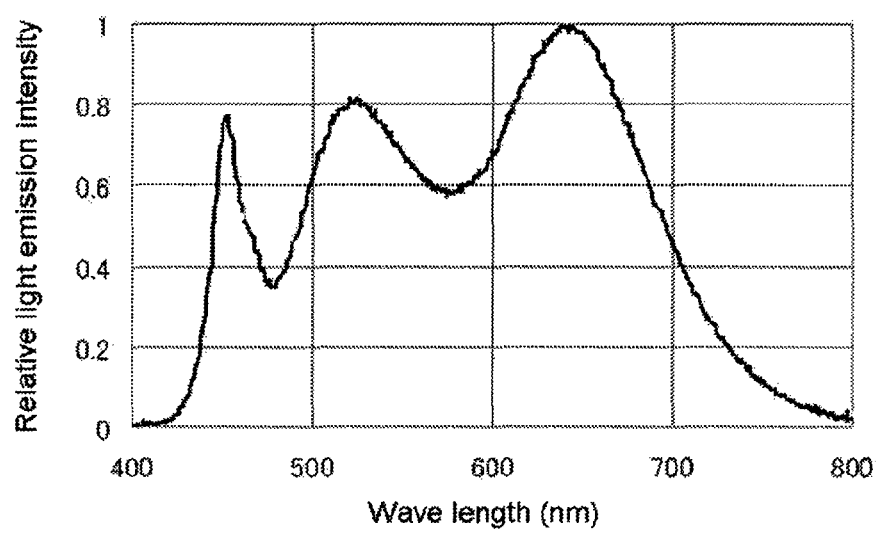
FIG. 4 is a graph showing an emission spectrum of the light emitting device 100 according to Example 3.

FIG. 4 shows the emission spectrum of the light emitting device 100 thus obtained.

The spectrum has the first peak around 450 nm, the second peak around 520 nm and the third peak around 640 nm.

The minimum relative light emission intensity between the second peak wavelength and the third peak wavelength is 75% of the relative light emission intensity of the second peak wavelength that is lower than the relative light emission intensity of the third peak wavelength. Ra value is as high as 89, showing high color rendering performance.

A light source for backlight made by using the light emitting device 100 similarly to Example 1 has NTSC ratio of 70%, with higher brightness of white light.

Example 4

The light emitting device 100 is made by the same method as that of Example 1, except that about 0.28 g of a halosilicate $Ca_8MgSi_4O_{16}Cl_2:Eu((Ca_{7.7},Eu_{0.3})MgSi_4O_{16}Cl_2)$ that has an emission peak around 515 nm, 0.16 g of a YAG phosphor $(Y_{2.95}(Al_{0.8}, Ga_{0.2})_5O_{12}:Ce_{0.05})$ that has an emission peak around 540 nm and a broad emission spectrum, and about 0.2 g of a nitride phosphor $CaAlSiBN_3:Eu((Ca_{0.99},Eu_{0.01})AlSiN_3)$ that has an emission peak around 650 nm are mixed with 3 g of a silicone resin composition.

Figure 5:
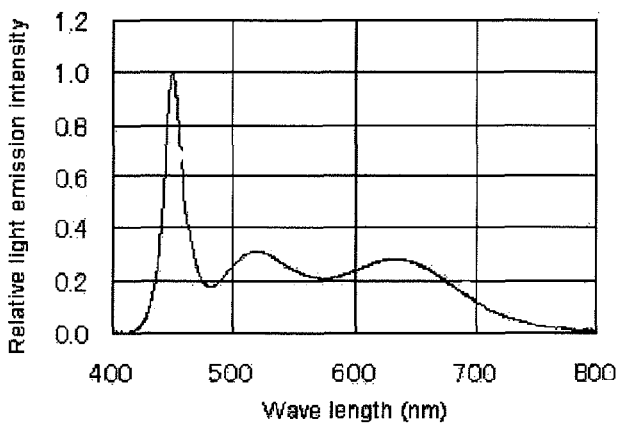
FIG. 5 is a graph showing an emission spectrum of the light emitting device 100 according to Example 4.

FIG. 5 shows the emission spectrum of the light emitting device 100 that is made as described above.

The spectrum has the first peak around 450 nm, the second peak around 520 nm and the third peak around 640 nm.

The minimum relative light emission intensity between the second peak wavelength and the third peak wavelength is 73% of the relative light emission intensity of the third peak wavelength that is lower than the relative light emission intensity of the second peak wavelength. A fairly high Ra value of 80 is obtained, showing high color rendering performance.

A light source for backlight made by using the light emitting device 100 similarly to Example 1 has NTSC ratio of 72%, with further higher brightness of white light.

Example 5

The light emitting device is made by the same method as that of Example 1, except that about 0.1 g of a halosilicate $Ca_3MgSi_4O_{16}Cl_2:Eu((Ca_{7.6},Eu_{0.4})MgSi_4O_{16}Cl_2)$ that has an emission peak around 520 nm, 0.3 g of a YAG phosphor $(Y_{2.95}(Al_{0.8}, Ga_{0.2})_5O_{12}:Ce_{0.05})$ that has an emission peak around 540 nm and a broad emission spectrum, and about 0.11 g of nitride phosphor $CaAlSiBN_3:Eu((Ca_{0.97},Eu_{0.03})AlSiBN_3)$ that has a peak wavelength around 660 nm are mixed with 3 g of a silicone resin composition.

FIG. 6 shows the emission spectrum of the light emitting device 100 that is made as described above.

The spectrum has the first peak around 450 nm, the second peak around 530 nm and the third peak around 640 nm.

The minimum relative light emission intensity between the second peak wavelength and the third peak wavelength is 96% of the relative light emission intensity of the second peak wavelength that is lower than the relative light emission intensity of the third peak wavelength. A fairly high Ra value of 93 is obtained, showing high color rendering performance.

A light source for backlight made by using the light emitting device 100 similarly to Example 1 has NTSC ratio of 64%.

Example 6

The light emitting device 100 is made by the same method as that of Example 1, except that about 0.22 g of a halosilicate $Ca_3MgSi_4O_{16}Cl_2:Eu((Ca_{7.7},Eu_{0.3})MgSi_4O_{16}Cl_2)$ that has an emission peak around 515 nm, 0.2 g of a YAG phosphor $(Y_{2.95}Al_5O_{12}:Ce_{0.05})$ that has an emission peak around 560 nm and a broad emission spectrum, and about 0.1 g of a nitride phosphor $CaAlSiBN_3:Eu((Ca_{0.99},Eu_{0.01})AlSiBN_3)$ that has an emission peak around 650 nm are mixed with 3 g of a silicone resin composition.

In this embodiment, the difference between the peak wavelength of the light emitting element (blue LED) 2 and the peak wavelength of the green phosphor 3B is 55 nm.

Figure 7:
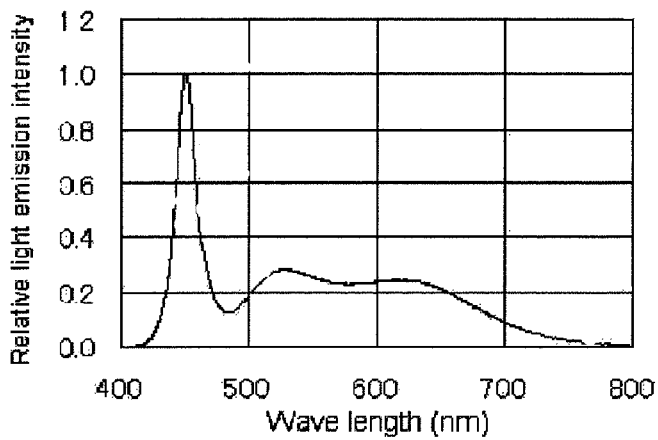
FIG. 7 is a graph showing an emission spectrum of the light emitting device 100 according to Example 6.

FIG. 7 shows the emission spectrum of the light emitting device 100 that is made as described above.

It has the first peak around 450 nm, the second peak around 530 nm and the third peak around 630 nm.

The minimum relative light emission intensity between the second peak wavelength and the third peak wavelength is 97% of the relative light emission intensity of the third peak wavelength that is lower than the relative light emission intensity of the second peak wavelength. A fairly high Ra value of 90 is obtained, showing high color rendering performance.

A light source for backlight made by using the light emitting device 100 similarly to Example 1 has NTSC ratio of 68%, with higher brightness of white light than that of Example 1.

Example 7

The light emitting device 100 is made by the same method as that of Example 1, except that about 0.18 g of a halosilicate $Ca_8MgSi_4O_{16}Cl_2$:Eu(($Ca_{7.7}$,$Eu_{0.3}$)$MgSi_4O_{16}Cl_2$) that has an emission peak around 515 nm, 0.08 g of a YAG phosphor ($Y_{2.95}Al_5O_{12}$:$Ce_{0.05}$) that has an emission peak around 560 nm and a broad emission spectrum, and about 0.26 g of a nitride phosphor $CaAlSiBN_3$:Eu(($Ca_{0.99}$,$Eu_{0.01}$)$AlSiBN_3$) that has an emission peak around 650 nm are mixed with 3 g of a silicone resin composition.

Figure 8:
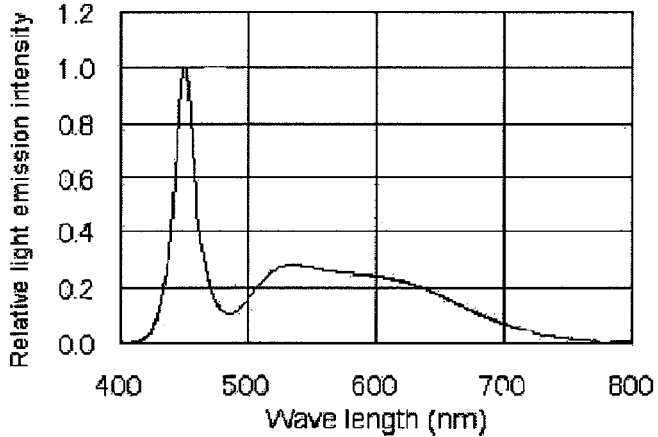
FIG. 8 is a graph showing an emission spectrum of the light emitting device 100 according to Example 7.

FIG. 8 shows the emission spectrum of the light emitting device 100 that is obtained.

The emission spectrum has an emission peak due to the light emitting element 2 and a broad emission peak due to the phosphors 3A, 3B, 3C, without distinct third peak observed.

The light emitting device shows fairly high color rendering performance with Ra value of 92.

A light source for backlight made by using this light emitting device similarly to Example 1 has NTSC ratio of 62%, with lower brightness of white light than that of Example 1.

Example 8

The light emitting device 100 is made by the same method as that of Example 1, except that about 0.28 g of a halosilicate $Ca_3MgSi_4O_{16}Cl_2$:Eu(($Ca_{7.7}$,$Eu_{0.3}$)$MgSi_4O_{16}Cl_2$) that has an emission peak around 515 nm, 0.14 g of a YAG phosphor ($Y_{2.95}Al_5O_{12}$:$Ce_{0.05}$) that has an emission peak around 560 nm and a broad emission spectrum, and about 0.14 g of a nitride phosphor $CaAlSiBN_3$:Eu(($Ca_{0.99}$,$Eu_{0.01}$)$AlSiBN_3$) that has an emission peak around 650 nm are mixed with 3 g of a silicone resin composition.

Figure 9:
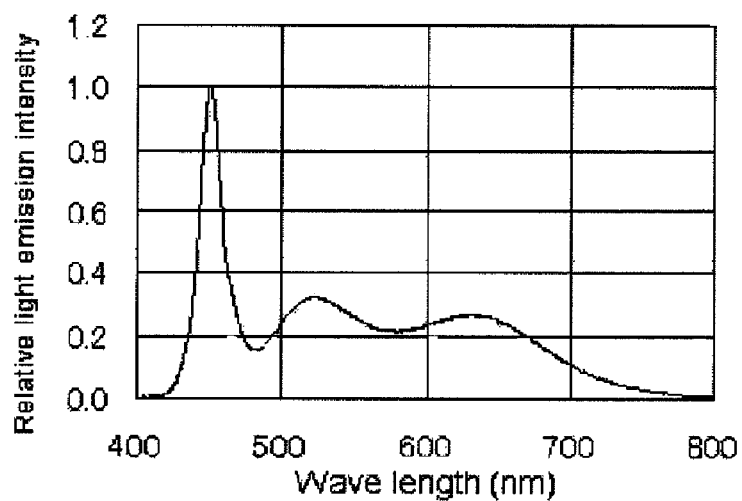
FIG. 9 is a graph showing an emission spectrum of the light emitting device 100 according to Example 8.

FIG. 9 shows the emission spectrum of the light emitting device 100 that is made as described above.

It has the first peak around 450 nm, the second peak around 520 nm and the third peak around 630 nm. The minimum relative light emission intensity between the second peak wavelength and the third peak wavelength is 82% of the relative light emission intensity of the third peak wavelength that is lower than the relative light emission intensity of the second peak wavelength. A fairly high Ra value of 88 is obtained, showing high color rendering performance.

A light source for backlight made by using this light emitting device similarly to Example 1 has NTSC ratio of 70%, with higher brightness of white light than that of Example 1.

Example 9

The light emitting device 100 is made by the same method as that of Example 1, except that about 0.28 g of a halosilicate $Ca_3MgSi_4O_{16}Cl_2$:Eu(($Ca_{7.7}$,$Eu_{0.3}$)$MgSi_4O_{16}Cl_2$) that has an emission peak around 515 nm, 0.14 g of a YAG phosphor (($Y_{0.8}$, $Gd_{0.2}$)$_{2.85}Al_5O_{12}$:$Ce_{0.15}$) that has an emission peak around 570 nm and a broad emission spectrum, and about 0.2 g of a nitride phosphor $CaAlSiBN_3$:Eu(($Ca_{0.99}$,$Eu_{0.01}$)$AlSiBN_3$) that has an emission peak around 650 nm are mixed with 3 g of a silicone resin composition.

Figure 10:
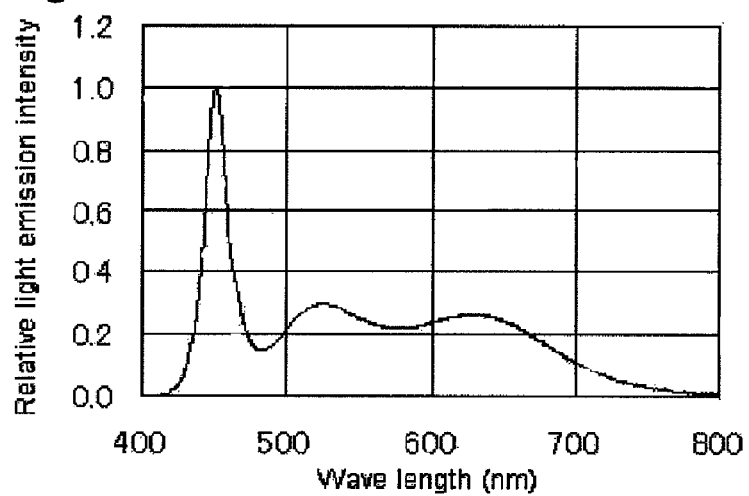
FIG. 10 is a graph showing an emission spectrum of the light emitting device 100 according to Example 9.

FIG. 10 shows the emission spectrum of the light emitting device 100 that is made as described above.

The spectrum has the first peak around 450 nm, the second peak around 520 nm and the third peak around 630 nm.

In the light emitting device thus obtained, the minimum relative light emission intensity between the second peak wavelength and the third peak wavelength is 83% of the relative light emission intensity of the third peak wavelength that is lower than the relative light emission intensity of the second peak wavelength.

Ra value is as high as 89, showing high color rendering performance.

A light source for backlight made by using the light emitting device 100 similarly to Example 1 has NTSC ratio of 67%, with higher brightness of white light than that of Example 1.

Example 10

The light emitting device 100 is made by the same method as that of Example 1, except that about 0.16 g of a halosilicate $Ca_3MgSi_4O_{16}Cl_2$:Eu(($Ca_{7.5}$,$Eu_{0.5}$)$MgSi_4O_{16}Cl_2$) that has an emission peak around 525 nm, 0.12 g of a YAG phosphor ($Y_{2.95}Al_5O_{12}$:$Ce_{0.05}$) that has an emission peak around 560 nm and a broad emission spectrum, and about 0.2 g of a nitride phosphor $CaAlSiBN_3$:Eu(($Ca_{0.99}$,$Eu_{0.01}$)$AlSiBN_3$) that has an emission peak around 650 nm are mixed with 3 g of a silicone resin composition.

Figure 11:
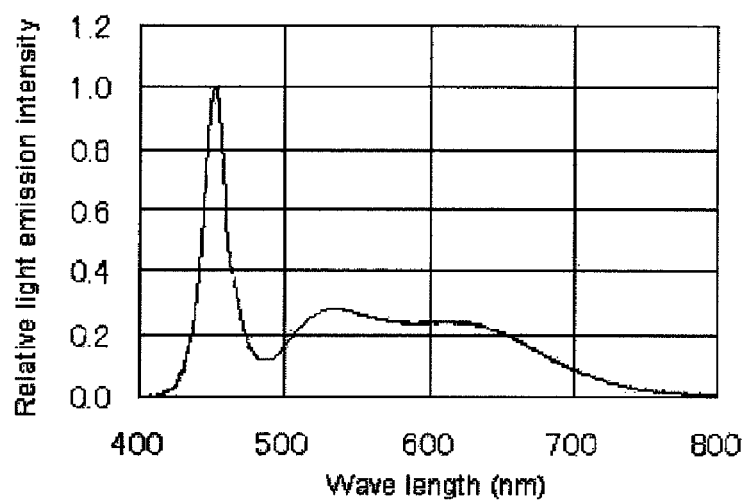
FIG. 11 is a graph showing an emission spectrum of the light emitting device 100 according to Example 10.

FIG. 11 shows the emission spectrum of the light emitting device 100 that is obtained.

The emission spectrum has an emission peak due to the light emitting element 2 and a broad emission peak due to the phosphors 3A, 3B, 3C, without distinct third peak observed.

The light emitting device shows fairly high color rendering performance with Ra value of 88.

A light source for backlight made by using this light emitting device similarly to Example 1 has NTSC ratio of 66%, with lower brightness of white light than that of Example 1.

Example 11

The light emitting device 100 is made by the same method as that of Example 1, except that about 0.22 g of a halosilicate $Ca_{7.85}Eu_{0.3}MgSi_{4.3}O_{15.91}Cl_{1.84}$ that has an emission peak around 515 nm, 0.2 g of a YAG phosphor ($Y_{2.95}Al_5O_{12}$:$Ce_{0.05}$) that has an emission peak around 560 nm and a broad emission spectrum, and about 0.1 g of a nitride phosphor $CaAlSiBN_3$:Eu(($Ca_{0.99}$,$Eu_{0.01}$)$AlSiBN_3$) that has an emission peak around 650 nm are mixed with 3 g of a silicone resin composition.

Figure 12:
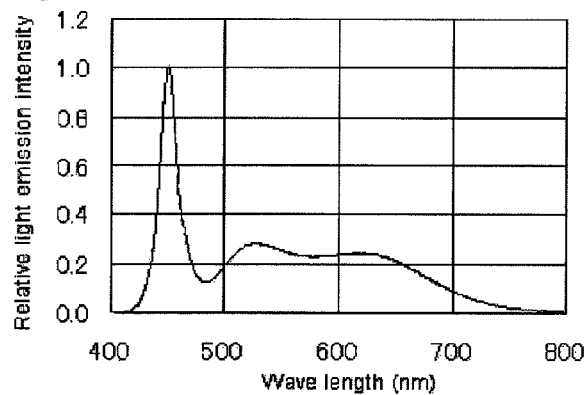
FIG. 12 is a graph showing an emission spectrum of the light emitting device 100 according to Example 11.

FIG. 12 shows the emission spectrum of the light emitting device 100 that is made as described above.

It has the first peak around 450 nm, the second peak around 520 nm and the third peak around 630 nm.

The minimum relative light emission intensity between the second peak wavelength and the third peak wavelength is 97% of the relative light emission intensity of the third peak wavelength that is lower than the relative light emission intensity of the second peak wavelength.

A fairly high Ra value of 89 is obtained, showing high color rendering performance.

A light source for backlight made by using the light emitting device 100 similarly to Example 1 has NTSC ratio of 68%, with higher brightness of white light than that of Example 1.

INDUSTRIAL APPLICABILITY

The present invention can be applied not only to lighting devices but also to the backlight of display apparatus such as monitor, digital camera or printer where high color rendering performance is required.

The invention claimed is:

1. A light emitting device, comprising:
a light emitting element;
a red phosphor formed from a nitride phosphor, the red phosphor emitting light when excited by the light from the light emitting element;
a green phosphor formed from a halosilicate, the green phosphor emitting light when excited by the light from the light emitting element; and
a YAG phosphor emitting light when excited by the light from the light emitting element;
wherein the emission spectrum thereof has a first peak at a wavelength between 440 nm and 470 nm, a second peak at a wavelength between 510 nm and 550 nm and a third peak at a wavelength between 630 nm and 670 nm, and the minimum relative light emission intensity between the second peak wavelength and the third peak wavelength is greater than 80% of whichever the lower of the relative light emission intensity of the second peak wavelength and the relative light emission intensity of the third peak wavelength;
wherein the wavelength of the first peak is attributed to the light from the light emitting element;
wherein the red phosphor is activated with Eu and is represented by the following general formula (I):

$$M^1_w Al_x Si_y B_z N_{((2/3)w+x+(4/3)y+z)}:Eu^{2+} \quad (I)$$

wherein $M^1$ is at least one kind of element selected from the group consisting of Mg, Ca, Sr and Ba, and relations: w=1, x=1, y=1 and $0 \leq z \leq 0.5$ are satisfied;
wherein the green phosphor is represented by the following general formula (II) or (III):

$$(M^2_{1-y}Eu_y)_a MgM^3_b O_{(a+2b)} X_2 \quad (II)$$

wherein $M^2$ is at least one kind of element selected from the group consisting of Ca, Sr, Ba, Zn and Mn, $M^3$ is Si, X is Cl, and relations: $0.001 \leq y \leq 0.3$, $7.0 \leq a < 10.0$, and $3.0 \leq b < 5.0$ are satisfied, $$M^5_x Eu_y MgSi_z O_a X_b \quad (III)$$

wherein $M^5$ is at least one kind of element selected from the group consisting of Ca, Sr, Ba, Zn and Mn, X is Cl, and relations: $6.5 \leq x < 8.0$, $0.01 \leq y \leq 2.0$, $3.7 \leq z \leq 4.3$, a=x+y+1+2z-b/2, and $1.0 \leq b \leq 1.9$ are satisfied, and
light emitted from the light emitting device has mean color rendering index Ra of 85 or more.

2. The light emitting device according to claim 1, wherein the difference between the peak wavelength of the light emitting element and the peak wavelength of the green phosphor is 80 nm or less.

3. The light emitting device according to claim 1, wherein the YAG phosphor is represented by the following general formula (IV):

$$M^6_3 M^7_5 O_{12}:Ce \quad (IV)$$

wherein $M^6$ is at least one kind of element selected from the group consisting of the rare earth elements, and $M^7$ is at least one kind of element selected from the group consisting of B, Al, Ga and In.

* * * * *